United States Patent [19]

Terazono

[11] Patent Number: 5,650,335
[45] Date of Patent: Jul. 22, 1997

[54] METHOD OF FABRICATING A SEMICONDUCTOR DEVICE INCLUDING A PROCESS OF ADJUSTING FET CHARACTERISTICS AFTER FORMING THE FET

[75] Inventor: Shinichi Terazono, Itami, Japan

[73] Assignee: Mitsubishi Denki Kabushiki Kaisha, Tokyo, Japan

[21] Appl. No.: 523,511

[22] Filed: Sep. 1, 1995

[30] Foreign Application Priority Data

Sep. 5, 1994 [JP] Japan ...................... 6-211052

[51] Int. Cl.$^6$ .......................... H01L 21/66; H01L 21/265; H01L 21/20; G01R 31/26
[52] U.S. Cl. ........................ 437/8; 437/24; 437/126; 324/765
[58] Field of Search .................... 437/8, 24, 126; 257/48; 324/765, 769

[56] References Cited

U.S. PATENT DOCUMENTS 4,360,964 11/1982 Gilly et al. ........................ 437/8
5,493,231 2/1996 Nicollian et al. .................. 324/769

FOREIGN PATENT DOCUMENTS 60-225479 11/1985 Japan .
371641 3/1991 Japan .

*Primary Examiner*—John Niebling
*Assistant Examiner*—Brian K. Dutton
*Attorney, Agent, or Firm*—Leydig, Voit & Mayer

[57] ABSTRACT

A fabricating method of a semiconductor device includes preparing a compound semiconductor substrate including an active layer epitaxially grown on the substrate, forming a test element group FET (TEGFET) having a characteristic value on the compound semiconductor substrate and measuring a characteristic value of the TEGFET, forming an FET having a characteristic value on the compound semiconductor substrate, measuring the characteristic value of the FET, obtaining a variation of the carrier concentration of the active layer of the FET relative to a required value by comparing the measured characteristic value of the FET with reference data obtained from the TEGFET and correcting the variation by implanting ions under conditions that correct the variation. Therefore, after forming a gate electrode of the FET, the carrier concentration of the active layer of the FET is corrected, so the the yield of the device is improved.

13 Claims, 9 Drawing Sheets carrier concentration dependency
of Vp - Idss characteristic carrier concentration dependency
of Vp - Ir characteristic 5,650,335

1

METHOD OF FABRICATING A SEMICONDUCTOR DEVICE INCLUDING A PROCESS OF ADJUSTING FET CHARACTERISTICS AFTER FORMING THE FET

FIELD OF THE INVENTION

The present invention relates to a fabricating method of a semiconductor device and, more particularly, to a fabricating method of a semiconductor device including a process of adjusting characteristics of an FET after forming the FET constituting the semiconductor device so that a device including a GaAs based epitaxial substrate can be fabricated with a stable yield.

BACKGROUND OF THE INVENTION

FIG. 8 shows a process flow of a prior art fabricating method of a semiconductor device. FIG. 9 is a sectional view of an FET structure formed by the prior art method. In FIG. 9, reference numeral 1 designates a semi-insulating GaAs substrate having a thickness of about 600 μm and an impurity concentration of $1 \times 10^{15}$ cm$^{-3}$. Reference numeral 2 designates an active layer having a thickness of about 0.5 to 0.6 μm and an impurity concentration of 1 to $3 \times 10^{17}$ cm$^{-3}$. Reference numeral 3 designates an alloy base ohmic electrode comprising such as Au, Ge, or Ni and having a thickness of 0.3 to 0.4 μm. Reference numeral 4 designates a gate electrode having Al as its main component and having a height of 0.45 to 0.6 μm and a gate width of 0.5 to 1 μm.

A description is given of the prior art process flow shown in FIG. 8.

Initially, a substrate including an epitaxial film grown to a prescribed standard is prepared (step S1), and ohmic electrodes 3 are formed (step S2). Then, a saturation current between the ohmic electrodes is adjusted by recess etching so that, for example, a thickness of an active layer is 0.15 μm (1500 angstroms). Thereafter, a gate electrode is formed on the recess, whereby an FET including a recess gate having a sectional structure shown in FIG. 9 is formed (step S3). Further, other processes, such as formation of wiring and a passivation film, are performed (step S7), thereby completing the whole process flow of the prior art.

In the above-described prior art process flow, the FET characteristics are adjusted only when the recess gate is formed (step S3). However, because it is impossible to correct minute variations of such as $1 \times 10^{16}$ cm$^{-3}$, in the carrier concentration of the epitaxial film by an adjustment, respective devices have different yields and it is impossible to fabricate and provide a device with a stable yield.

SUMMARY OF THE INVENTION

An object of the present invention is to provide a fabricating method of a semiconductor device including a process flow in which variations in the carrier concentration of an epitaxial film can be adjusted during processes after forming a gate electrode of an FET.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method of fabricating a semiconductor device employing a

2 compound semiconductor substrate including an active layer epitaxially grown thereon includes forming a test element group FET (hereinafter referred to as a TEGFET) on the compound semiconductor substrate and measuring its characteristic value, forming an FET constituting the semiconductor device on the compound semiconductor substrate, measuring the characteristic value of the FET, obtaining the variation quantity of the carrier concentration of the FET relative to a required value by comparing the measured characteristic value of the FET with reference data obtained from the TEGFET, and when the variation quantity is required to be corrected, performing ion implantation to the substrate on the ion implantation condition that can correct the variation quantity after forming the FET, thereby correcting the variation quantity. Therefore, after forming a gate electrode of the FET, the carrier concentration of the active layer of the FET is corrected and reduced.

According to a second aspect of the present invention, in the fabricating method of the semiconductor device, the characteristic values of the FET constituting the semiconductor device are a value of a pinch-off voltage (Vp) and a value of a saturation current between source and drain electrodes (Idss) just after forming the gate electrode. Therefore, the carrier concentration of the FET while being formed can be obtained from the characteristic values.

According to a third aspect of the present invention, in the fabricating method of the semiconductor device, the characteristic values of the FET constituting the semiconductor device are a value of a pinch-off voltage (Vp) and a value of a recess current (Ir) just after forming the gate electrode. Therefore, the carrier concentration of the FET while being formed can be obtained from the characteristic values.

According to a fourth aspect of the present invention, in the fabricating method of the semiconductor device, the variation quantity is corrected by implanting hydrogen ions. Therefore, the fine adjustment of the carrier concentration can be carried out.

According to a fifth aspect of the present invention, in the fabricating method of the semiconductor device, the hydrogen ions are implanted to the entire surface of the substrate or only into an FET region. Therefore, the ion implantation into a required region can be performed.

According to a sixth aspect of the present invention, in the fabricating method of the semiconductor device, the correction of the variation quantity includes performing annealing at a temperature from 200° C. to 400° C. after the ion implantation to diffuse the implanted hydrogen atoms equally to the portion under the gate electrode. Therefore, a corrected carrier concentration having uniformity can be obtained.

According to a seventh aspect of the present invention, in the fabricating method of the semiconductor device, the compound semiconductor constituting the semiconductor device comprises GaAs, InGaAs, or AlGaAs. Therefore, a semiconductor device comprising any of these materials can be obtained.

DETAILED DESCRIPTION OF THE PREFERRED EMBODIMENTS

[Embodiment 1]

Figure 1:
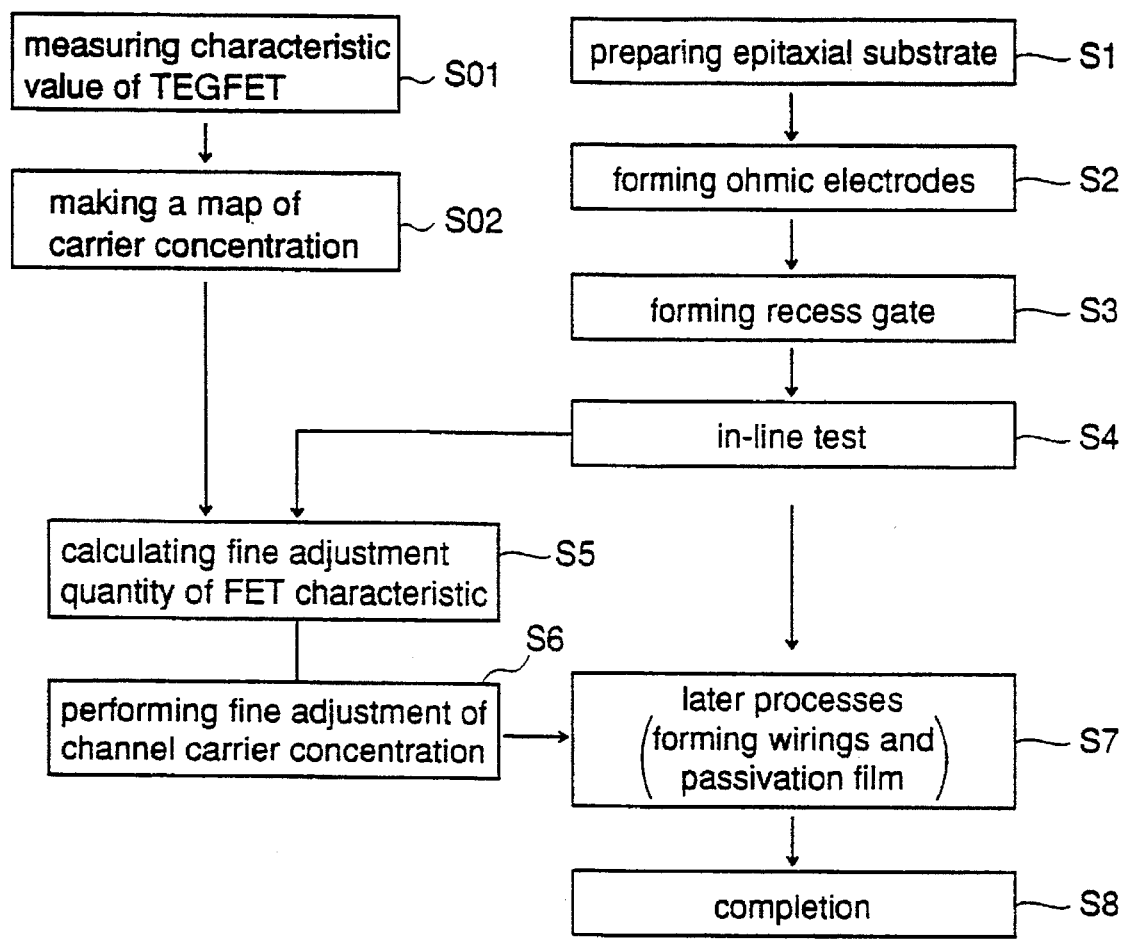
FIG. 1 is a process flow illustrating a method of fabricating a semiconductor device in accordance with a first embodiment of the present invention.
Figure 2:
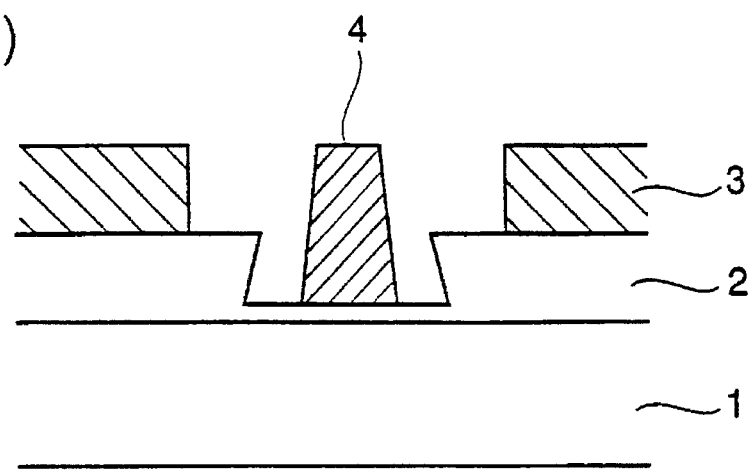
FIGS. 2(a)–2(c) are sectional views schematically illustrating an FET in each process step of the process flow shown in FIG. 1.
Figure 2:
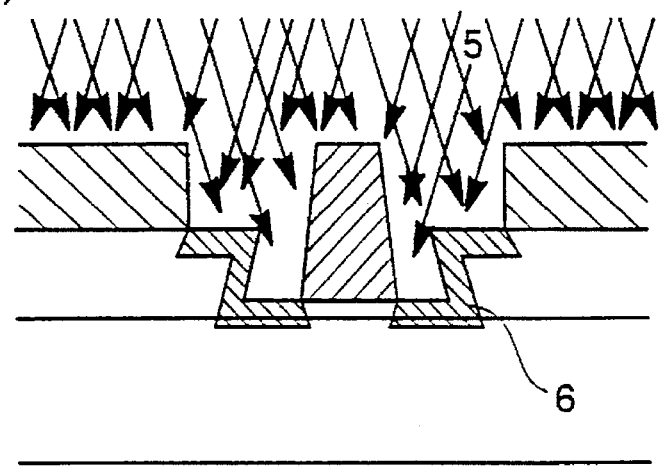
Figure 2:
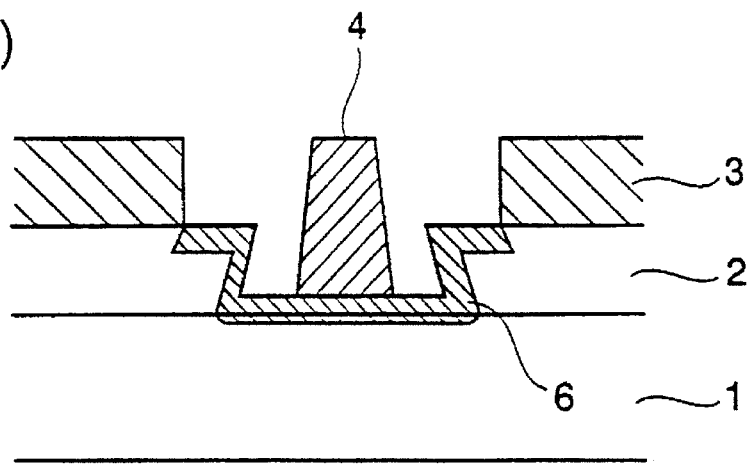
Figure 8:
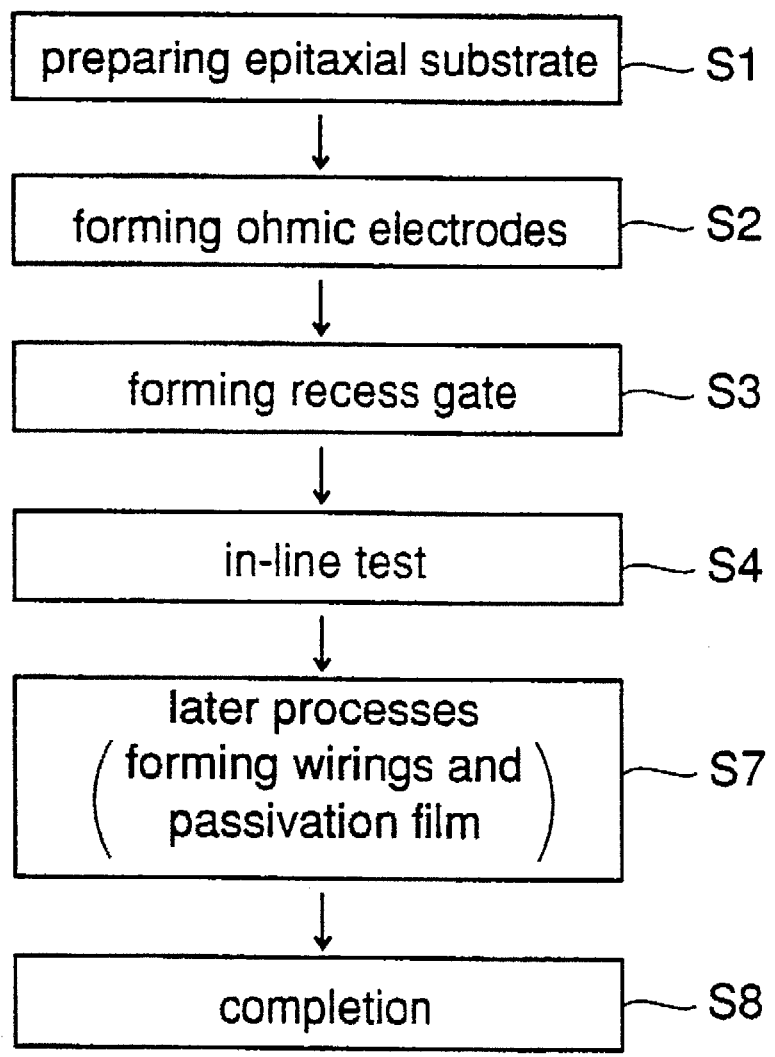
FIG. 8 is a process flow illustrating a prior art method of fabricating a semiconductor device.
Figure 9:
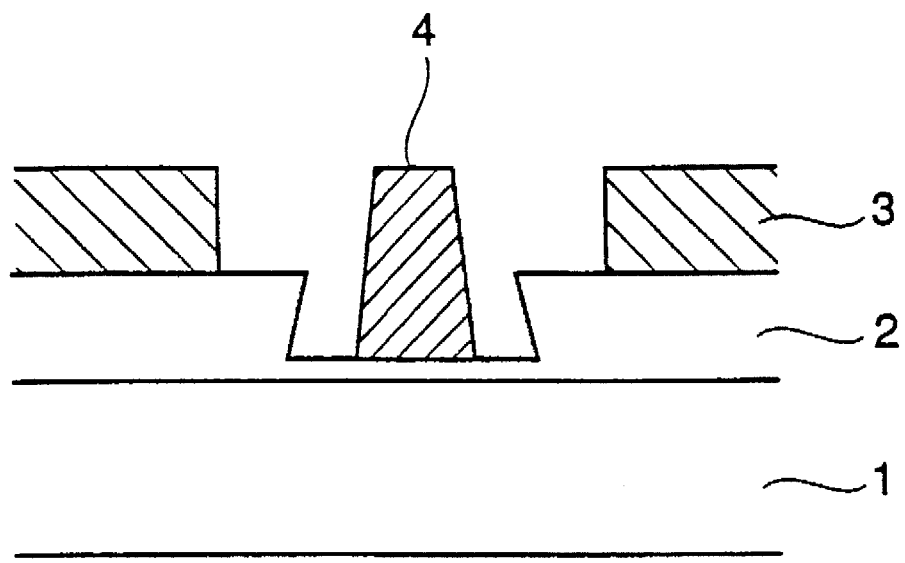
FIG. 9 is a sectional view schematically illustrating an FET in each step of the prior art process flow shown in FIG. 8.

FIG. 1 is a process flow illustrating a method of fabricating a GaAs base device including a process for adjusting FET characteristics in the device, according to a first embodiment of the present invention. FIGS. 2(a) to 2(c) are sectional views schematically illustrating an FET during processing. In these figures, the same reference numerals as in FIGS. 8 and 9 designate the same or corresponding parts. A GaAs substrate 1, an active layer 2, ohmic electrodes 3, and a gate electrode 4 are formed as described in FIG. 9. Ion beams 5 implantions into a region 6 in the substrate 1.

Figure 3:
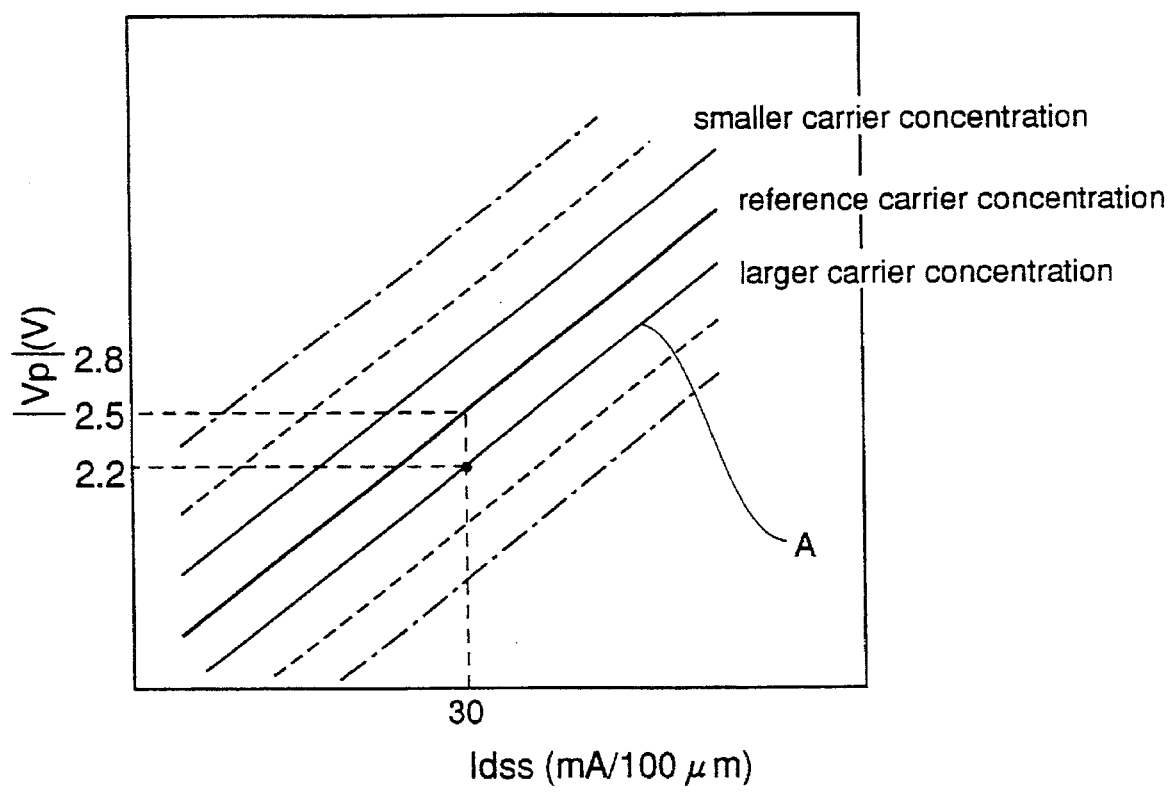
FIG. 3 is a graph illustrating carrier concentration dependency of the Vp-Idss characteristic of an FET fabrication in accordance with a first embodiment of the present invention.
Figure 4:
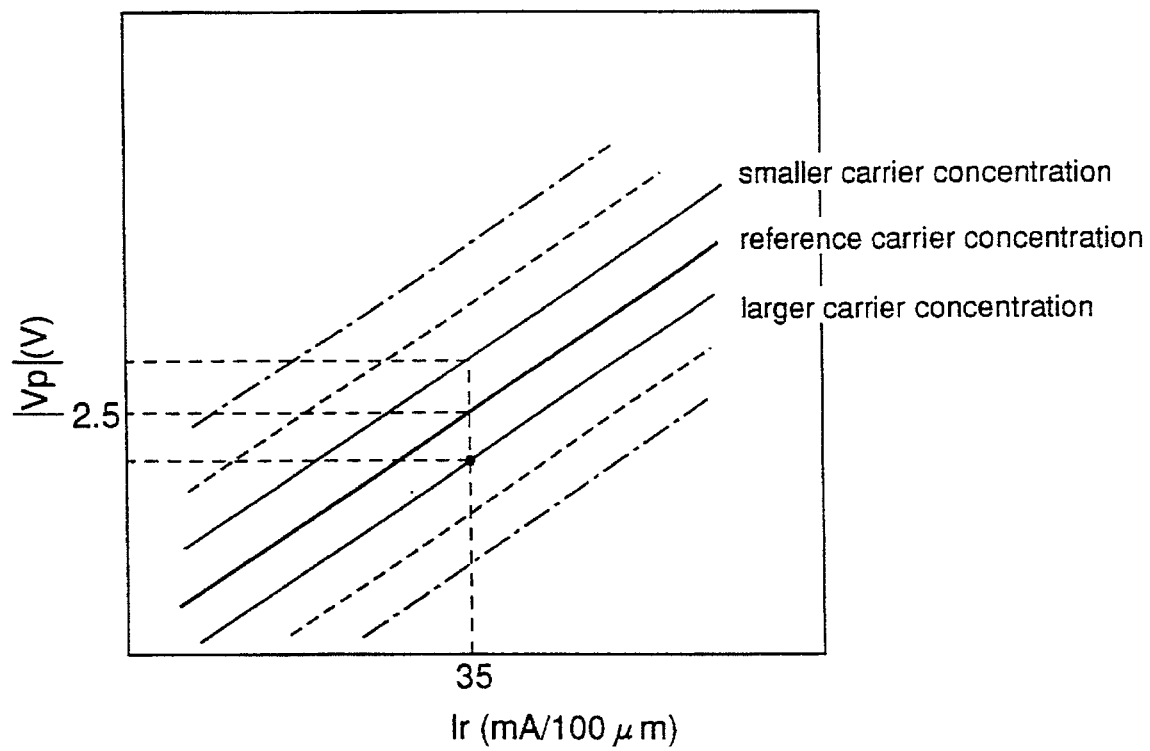
FIG. 4 is a graph illustrating carrier concentration dependency of the Vp-Ir characteristic of an FET fabrication in accordance with a first embodiment of the present invention.
Figure 5:
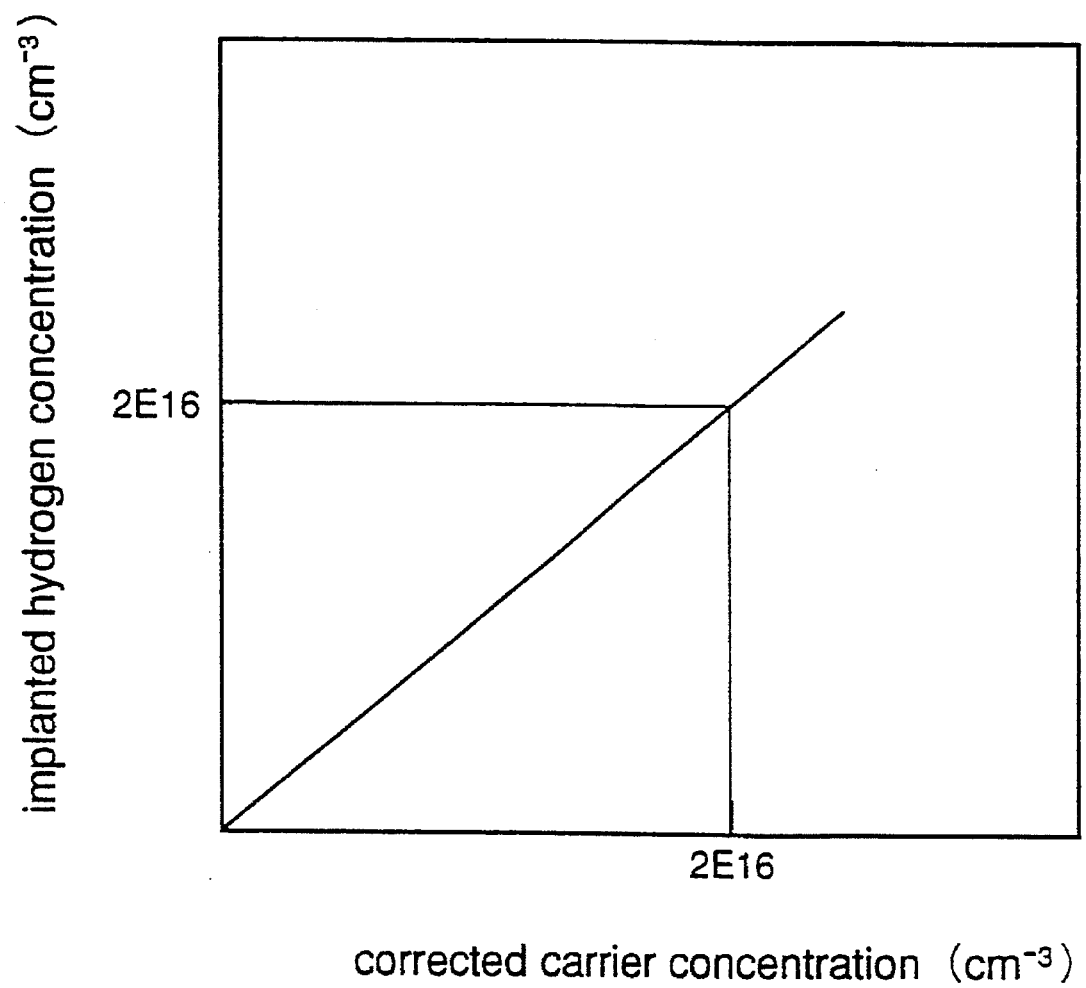
FIG. 5 is a graph illustrating the relation between a corrected carrier concentration and an implanted hydrogen concentration in accordance with a first embodiment of the present invention.

FIGS. 3 and 4 are graphs showing a Vp-Idss characteristic and a Vp-Ir characteristic of an FET, obtained from a test element group FET (TEGFET) TEGFET, respectively, and each graph is employed as a carrier concentration map when the carrier concentration is deduced. FIG. 5 is a graph illustrating the relation between a corrected carrier concentration and an implanted hydrogen concentration, for obtaining the implanted hydrogen concentration required for correcting the carrier concentration obtained from FIGS. 3 and 4.

A description is given of a method of fabricating a semiconductor device including a process for adjusting the FET characteristics, according to this first embodiment of the invention.

In FIG. 1, as described with respect to the prior art method, employing a substrate having an epitaxial film grown to a prescribed standard (step S1), ohmic electrodes 3 are formed (step S2). Then, a saturation current between the ohmic electrodes is adjusted by recess etching. Thereafter, a gate electrode is formed on the recess, whereby an FET including a recess gate having a sectional structure shown in FIG. 2(a) is formed (step S3).

After forming the gate electrode, a characteristic value of the FET is measured in an in-line test (step S4). Examples of the characteristic values are pinch-off voltage, Vp, saturation current between the source and drain electrodes, and recess current, Iv. When a required characteristic value is obtained by the test, other processes are successively performed, thereby completing the semiconductor device. However, when the required value is not obtained, the Vp-Idss characteristic of the FET is measured, whereby the variation quantity of the carrier concentration of the active layer from the required value is deduced from the correlation between the measured value of the Vp-Idss characteristic and the carrier concentration dependency of the Vp-Idss characteristic shown in FIG. 3, which was previously obtained from a TEGFET. In addition, while this variation is obtained from FIG. 3, since the characteristic values shown in FIG. 3 vary dependent on gate length and recess shape, it is required, to deduce the characteristic values shown in FIG. 3 as the carrier concentration map of the Vp-Idss characteristics of the FET, for the TEGFET having a carrier concentration previously and exactly known.

When the carrier concentration obtained from FIG. 3 is larger than the required value, the implanted hydrogen concentration is deduced from its variation on the basis of the relation between the corrected carrier concentration and the implanted hydrogen concentration shown in FIG. 5.

The condition of implanted hydrogen ions is calculated from the implanted hydrogen concentration deduced as described above and the implantation depth deduced from the device structure (step S5), whereby hydrogen ion implantation is performed to the entire surface of the substrate as shown in FIG. 2(b).

By annealing at 380° C. for ten minutes, hydrogen atoms implanted into the surface of the substrate are diffused equally to the portion under the gate electrode as shown in FIG. 2(c) (step S6).

Thereafter, other processes, such as the formation of wiring and the formation of a passivation film, are performed (step S7), thereby completing the fabrication process (step S8).

A description is given of a process of deducing the carrier concentration when the FET has the Vp-Idss characteristic shown by the solid line A in FIG. 3 and a process of adjusting the FET characteristics by ion implantation.

As shown in FIG. 3, the FET has the FET characteristic in which, when the Idss is 30 (mA/100 μm), the value of the Vp is smaller than 2.5 V by 0.3 V.

In the carrier concentration map shown in FIG. 3, solid lines, broken lines, and dash and dotted lines which run parallel with a reference carrier concentration (shown by a heavy line in the figure) on both sides thereof show characteristics of FETs having the carrier concentrations shifted from the reference carrier concentration by $2 \times 10^{16}$ cm$^{-3}$, $4 \times 10^{16}$ cm$^{-3}$, and $6 \times 10^{16}$ cm$^{-3}$, respectively. In these characteristics, the FET including the characteristic of the solid line A has a carrier concentration larger than that of the reference value by $2 \times 10^{16}$ cm$^{-3}$. The implanted hydrogen concentration is deduced from this variation quantity, i.e., the carrier concentration to be corrected, and FIG. 5 which shows the relation between the corrected carrier concentration and the implanted hydrogen concentration. When the corrected carrier concentration is $2 \times 10^{16}$ cm$^{-3}$, the implanted hydrogen concentration is $2 \times 10^{16}$ cm$^{-3}$.

More specifically, as shown in FIG. 5, the ratio of the corrected carrier concentration to the implanted hydrogen concentration is 1:1. For example, when boron (B) is employed rather than hydrogen, the implanted boron concentration and the carrier concentration are in a ratio that the carrier concentration is about 10 to when the implanted boron concentration is 1, showing difficulty in finely adjusting the carrier concentration relative to using hydrogen. From the described above, the exact correction is possible when hydrogen ion is employed.

The implantation profile is determined by the implanted hydrogen concentration deduced as described above and a required implantation depth. For example, when it is required to implant the hydrogen ions having a concentration of $2\times10^{16}$ cm$^{-3}$ into a 0.2 μm deep region, the implantation is performed with an implantation energy of 25 keV and dosage of $4\times10^8$ cm$^{-2}$.

Meanwhile, the variation quantity may be deduced from the carrier concentration dependency of the Vp-Ir characteristic shown in FIG. 4, which was previously obtained from a TEGFET.

In addition, on the assumption that the Vp is a function of the Idss and the carrier concentration is n, representing it by an approximate formula:

Vp=f(Idss, n), or on the assumption that the Vp is a function of the Ir and the carrier concentration is n, representing it by an approximate formula:

Vp=f(Ir, n), the measured characteristic values are replaced by Vp, Idss, and Ir, respectively, thereby obtaining the carrier concentration n.

In the method of fabricating the semiconductor device according to the first embodiment of the present invention, after forming the recess gate, the characteristic value of the FET is measured. When the required value of the FET can not be obtained, the condition of implanted hydrogen ions is calculated from the Vp-Idss characteristic value of the FET, the figure which shows the carrier concentration dependency of the Vp-Idss characteristic of a TEGFET which was previously deduced, and the figure which shows the relation between the corrected carrier concentration and the implanted hydrogen concentration. Then, hydrogen ions are implanted to the entire surface of the substrate, thereby adjusting of the FET characteristic. Therefore, minute variations in the characteristic values of the respective elements can be corrected after forming the recess gate, whereby the yield of the device is improved.

[Embodiment 2]

In the first embodiment of the present invention, after the in-line test (step S4), the condition of implanted hydrogen ions is calculated and, then, the ion implantation is performed to the entire surface of the substrate. However, this ion implantation may be performed only into an FET region.

In this second embodiment of the invention, the above-described ion implantation is carried out only into an FET region in place of the entire surface of the substrate. Also in this embodiment, similar to the first embodiment, after forming the recess gate, the minute variations in the characteristic value can be corrected, whereby the yield of the device is improved.

[Embodiment 3]

In the first embodiment of the invention, the condition of implanted hydrogen ions is calculated and, then, the hydrogen ions are implanted into the entire surface of the substrate. Then, by annealing at 380° C. for ten minutes, hydrogen atoms implanted in the surface of the substrate are diffused equally to the portion under the gate electrode, thereby performing the fine adjustment of the carrier concentration (step S6). However, the annealing after the ion implantation can be performed at a temperature from 200° C. to 400° C., and the annealing time is determined in accordance with the annealing temperature.

From the property of the FET employed in this third embodiment, since the heat resisting temperature of the GaAs substrate or that of an ohmic electrode is about 400° C., the annealing is performed below 400° C. The annealing at 400° C. is performed for several seconds to several tens of seconds. Further, the annealing may be performed at any time after the ion implantation. For example, although the annealing at about 200° C. for 48 hours is normally performed in the final process, the annealing of this third embodiment can be substituted for the normal final annealing process, thereby omitting the final annealing process.

In this third embodiment of the invention, the temperature of the annealing process is selected from within the range, whereby an arbitrary adjustment is made possible. Further, an other annealing after the ion implantation can be substituted for the annealing of this embodiment, resulting in omission of an annealing process.

[Embodiment 4]

Figure 6:
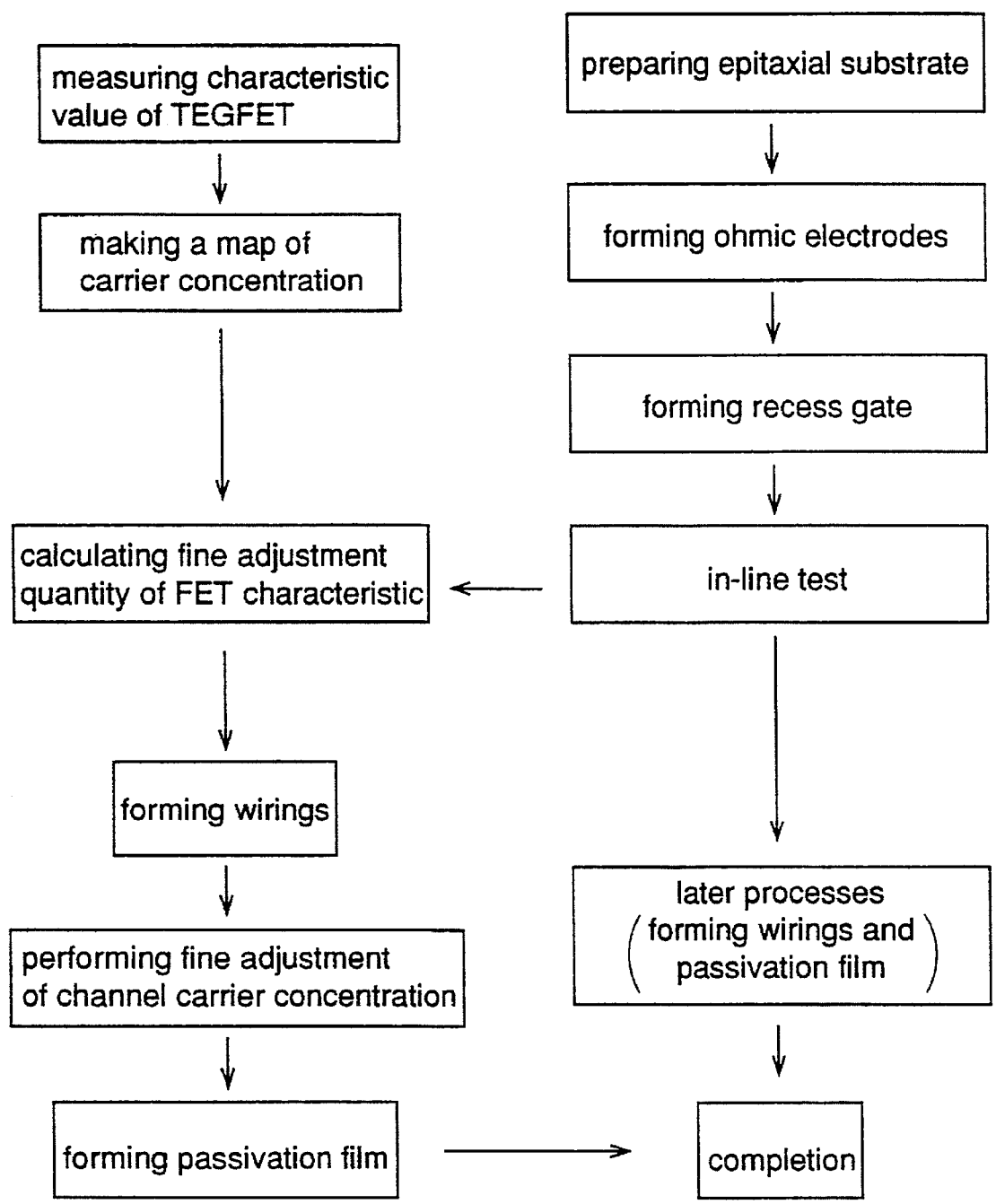
FIG. 6 is a process flow illustrating a method of fabricating a semiconductor device in accordance with a fourth embodiment of the present invention.

FIG. 6 shows a process flow of a fabricating method of a semiconductor device according to a fourth embodiment of the present invention. In the first embodiment, as shown in FIG. 1, after the in-line test (step S4), ion implantation is performed immediately after the condition of implanted hydrogen ions is calculated. In this fourth embodiment, after forming the wirings and before forming the passivation film, the ion implantation may be carried out. In addition, as described in the second embodiment, the ion implantation may be performed only into an FET region. Further, the annealing process may be performed as in the third embodiment.

In this fourth embodiment of the invention, the ion implantation is performed after the in-line test, and after forming the wirings and before forming the passivation film. Also in this embodiment, similar to the first embodiment, minute variations in the characteristic values of the respective elements can be corrected after the formation of the recess gate, whereby the yield of the device is improved.

[Embodiment 5]

Figure 7:
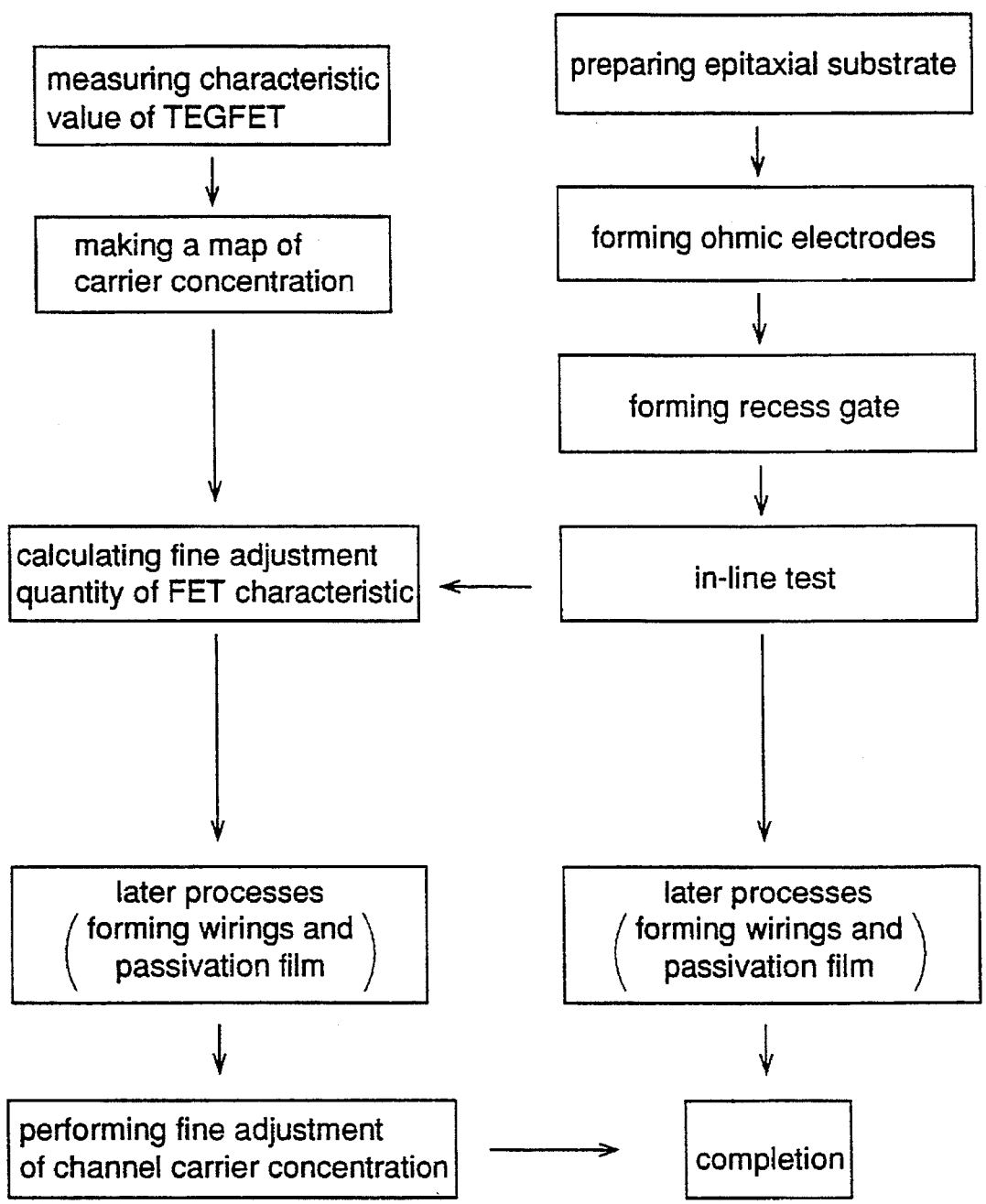
FIG. 7 is a process flow illustrating a method of fabricating a semiconductor device in accordance with a fifth embodiment of the present invention.

FIG. 7 shows a process flow of a fabricating method of a semiconductor device according to a fifth embodiment of the present invention. In the first embodiment, as shown in FIG. 1, after the in-line test (step S4), the ion implantation is performed immediately after the condition of implanted hydrogen ions is calculated. In this fifth embodiment, the ion implantation is carried out after forming wiring and forming a passivation film in later processes. In this embodiment, when the condition of implanted hydrogen ions is determined, it is necessary to determine the energy of the ion implantation considering the thickness of the passivation film formed in the later process.

In addition, as in the second embodiment, the ion implantation may be performed only into the FET region. Further, the annealing process may be performed as in the third embodiment.

In this fifth embodiment of the invention, the ion implantation is performed after the in-line test, after forming the wirings, and after forming the passivation film. Also in this fifth embodiment, similar to the first embodiment, minute variations in the characteristic values of the respective elements can be corrected after the formation of the recess gate, whereby the yield of the device is improved.

What is claimed is:

1. A method of fabricating a semi-conductor device including:

preparing a compound semiconductor substrate including an active layer having a carrier concentration and epitaxially grown on the compound semiconductor substrate;

forming a test element group field effect transistor (TEGFET) having a characteristic value on the compound semiconductor substrate and measuring the characteristic value;

forming a field effect transistor (FET) having a characteristic value on the compound semiconductor substrate;

measuring the characteristic value of the FET;

obtaining the carrier concentration of the active layer of the FET relative to a required carrier concentration as a variation quantity by comparing the measured characteristic value of the FET with reference data obtained from the TEGFET; and implanting ions in the substrate to correct the variation quantity after forming the FET.

2. The method of claim 1 wherein the characteristic values of the FET are a pinch-off voltage (Vp) and a saturation current between source and drain electrodes (Idss).

3. The method of claim 1 wherein the characteristic values of the FET are a pinch-off voltage (Vp) and a recess current (Ir).

4. The method of claim 1 including correcting the variation quantity by implanting hydrogen ions.

5. The method of claim 1 including implanting hydrogen ions over all of the substrate.

6. The method of claim 1 including correcting the variation quantity by annealing at a temperature from 200° C. to 400° C. after said ion-implantation to diffuse the implanted hydrogen atoms under the gate electrode of the FET.

7. The method of claim 1 wherein said compound semiconductor substrate comprises a material selected from the group consisting of GaAs, AlGaAs, and AlGaAs.

8. The method of claim 2 wherein said compound semiconductor substrate comprises a material selected from the group consisting of GaAs, AlGaAs, and AlGaAs.

9. The method of claim 3 wherein said compound semiconductor substrate comprises a material selected from the group consisting of GaAs, AlGaAs, and AlGaAs.

10. The method of claim 4 wherein said compound semiconductor substrate comprises a material selected from the group consisting of GaAs, AlGaAs, and AlGaAs.

11. The method of claim 5 wherein said compound semiconductor substrate comprises a material selected from the group consisting of GaAs, AlGaAs, and AlGaAs.

12. The method of claim 6 wherein said compound semiconductor substrate comprises a material selected from the group consisting of GaAs, AlGaAs, and AlGaAs.

13. The method of claim 4 including implanting hydrogen ions only in a region including the FET.

* * * * *